(12) United States Patent
Refai-Ahmed et al.

(10) Patent No.: US 9,879,661 B2
(45) Date of Patent: Jan. 30, 2018

(54) VIBRATIONAL FLUID MOVER JET WITH ACTIVE DAMPING MECHANISM

(71) Applicant: General Electric Company, Schenectady, NY (US)

(72) Inventors: Gamal Refai-Ahmed, Albany, NY (US); John Anthony Vogel, Charlton, NY (US); Christian M. Giovanniello, Schenectady, NY (US)

(73) Assignee: General Electric Company, Schenectady, NY (US)

( * ) Notice: Subject to any disclaimer, the term of this patent is extended or adjusted under 35 U.S.C. 154(b) by 763 days.

(21) Appl. No.: 14/473,152

(22) Filed: Aug. 29, 2014

(65) Prior Publication Data

US 2016/0061194 A1    Mar. 3, 2016

(51) Int. Cl.
*F04B 17/03* (2006.01)
*F04B 43/04* (2006.01)
(Continued)

(52) U.S. Cl.
CPC ............ *F04B 17/03* (2013.01); *F04B 43/046* (2013.01); *F04B 45/047* (2013.01); *F04F 7/00* (2013.01);
(Continued)

(58) Field of Classification Search
CPC .... F04B 17/003; F04B 43/046; F04B 45/047; F04B 39/044; B05B 17/0646
See application file for complete search history.

(56) References Cited

U.S. PATENT DOCUMENTS 5,308,224 A * 5/1994 Olivero ................. F04D 29/668
                                                              415/119
5,310,157 A * 5/1994 Platus ..................... F16F 3/026
                                                              248/619
(Continued)

FOREIGN PATENT DOCUMENTS

JP          5123041 B2    1/2013
WO      2010116322 A1   10/2010
WO      2013166394 A1   11/2013

OTHER PUBLICATIONS

European Search Report and Opinion issued in connection with corresponding EP Application No. 5182565.0 dated Feb. 11, 2016.
(Continued)

*Primary Examiner* — Thomas E Lazo
*Assistant Examiner* — Matthew Wiblin
(74) *Attorney, Agent, or Firm* — Ziolkowski Patent Solutions Group, SC; Jean K. Testa

(57) ABSTRACT

A vibrational fluid mover assembly having an active damping mechanism is disclosed. The vibrational fluid mover assembly includes a vibrational fluid mover having a first plate, a second plate spaced apart from the first plate, a spacer element having an orifice formed therein and being positioned between the first and second plates to maintain the first and second plates in a spaced apart relationship, and an actuator element coupled to at least one of the first and second plates to selectively cause deflection thereof such that a fluid flow is generated and projected out from the orifice. The vibrational fluid mover assembly also includes an absorber system connected to the vibrational fluid mover and providing active damping to the vibrational fluid mover, with the absorber system having suspension tabs coupled to
(Continued)

the vibrational fluid mover and spring components configured to mount the vibrational fluid mover in a suspended arrangement.

19 Claims, 5 Drawing Sheets

(51) Int. Cl.
    *F04B 45/047*     (2006.01)
    *F04F 7/00*     (2006.01)
    *H01L 23/467*     (2006.01)
    *H01L 23/40*     (2006.01)
    *F15D 1/00*     (2006.01)

(52) U.S. Cl.
    CPC ............ *H01L 23/40* (2013.01); *H01L 23/467* (2013.01); *F15D 1/0095* (2013.01); *H01L 2924/0002* (2013.01)

(56) References Cited

U.S. PATENT DOCUMENTS

| | | | |
|---|---|---|---|
| 6,722,581 B2 | 4/2004 | Saddoughi | |
| 7,204,615 B2 | 4/2007 | Arik et al. | |
| 7,387,491 B2 | 6/2008 | Saddoughi et al. | |
| 7,424,979 B1* | 9/2008 | Chen ................ B05B 17/0684 | |
| | | | 239/102.1 |
| 7,543,961 B2 | 6/2009 | Arik et al. | |
| 7,556,406 B2 | 7/2009 | Petroski et al. | |
| 7,688,583 B1 | 3/2010 | Arik et al. | |
| 7,931,212 B2* | 4/2011 | Urich ................ A61M 11/005 | |
| | | | 239/102.1 |
| 7,990,705 B2 | 8/2011 | Bult et al. | |
| 8,006,917 B2 | 8/2011 | Arik et al. | |
| 8,051,905 B2 | 11/2011 | Arik et al. | |
| 8,083,157 B2 | 12/2011 | Arik et al. | |
| 8,120,908 B2 | 2/2012 | Arik et al. | |
| 8,136,576 B2 | 3/2012 | Grimm | |
| 8,136,767 B2 | 3/2012 | Cueman et al. | |
| 8,308,078 B2 | 11/2012 | Arik et al. | |
| 8,342,819 B2* | 1/2013 | Arik ........................ H01L 23/40 | |
| | | | 239/102.2 |
| 8,418,934 B2 | 4/2013 | Arik et al. | |
| 8,430,644 B2 | 4/2013 | Mahalingam et al. | |
| 8,434,906 B2 | 5/2013 | Arik et al. | |
| 8,453,715 B2 | 6/2013 | Arik et al. | |
| 8,496,049 B2 | 7/2013 | Arik et al. | |
| 8,529,097 B2 | 9/2013 | Arik et al. | |
| 8,564,217 B2 | 10/2013 | Han et al. | |
| 8,602,607 B2 | 12/2013 | Arik et al. | |
| 8,646,701 B2 | 2/2014 | Grimm et al. | |
| 2003/0047620 A1* | 3/2003 | Litherland ........... A61M 11/005 | |
| | | | 239/102.1 |
| 2007/0119573 A1* | 5/2007 | Mahalingam ........... F28F 13/02 | |
| | | | 165/80.4 |
| 2008/0006393 A1* | 1/2008 | Grimm .............. H05K 7/20172 | |
| | | | 165/84 |
| 2008/0174620 A1* | 7/2008 | Tanner ................. B41J 2/14201 | |
| | | | 347/10 |
| 2008/0226473 A1* | 9/2008 | Lee ........................ F04B 35/045 | |
| | | | 417/363 |
| 2009/0084866 A1 | 4/2009 | Grimm et al. | |
| 2010/0054973 A1 | 3/2010 | Arik et al. | |
| 2011/0114287 A1* | 5/2011 | Arik .................... H05K 7/20172 | |
| | | | 165/67 |
| 2011/0139429 A1 | 6/2011 | Salapakkam et al. | |
| 2011/0139893 A1 | 6/2011 | Wetzel et al. | |
| 2011/0162823 A1* | 7/2011 | Sharma ................. H01L 23/467 | |
| | | | 165/104.34 |
| 2011/0174462 A1 | 7/2011 | Arik et al. | |
| 2012/0018537 A1 | 1/2012 | Arik et al. | |
| 2012/0097377 A1 | 4/2012 | Arik et al. | |
| 2012/0170216 A1 | 7/2012 | Arik et al. | |
| 2013/0213618 A1 | 8/2013 | Arik et al. | |
| 2013/0230934 A1 | 9/2013 | Arik et al. | |
| 2013/0264909 A1 | 10/2013 | Glaser et al. | |
| 2013/0336035 A1 | 12/2013 | Ramabhadran et al. | |
| 2014/0034270 A1 | 2/2014 | de Bock et al. | |
| 2014/0049970 A1 | 2/2014 | de Bock et al. | |

OTHER PUBLICATIONS

Moheimani, "A Survey of Recent a Survey of Recent Innovations in Vibration Damping and Control Using Shunted Piezoelectric Transducers", IEEE Transactions on Control Systems Technology, vol. 11, No. 4, Jul. 2003, pp. 482-494.

Casella et al., "Modelling and control for vibration suppression in a large flexible structure with jet thrusters and piezoactuators", IEEE Transactions on Control Systems Technology, vol. 10, No. 4, Jul. 2002, pp. 589-599.

* cited by examiner

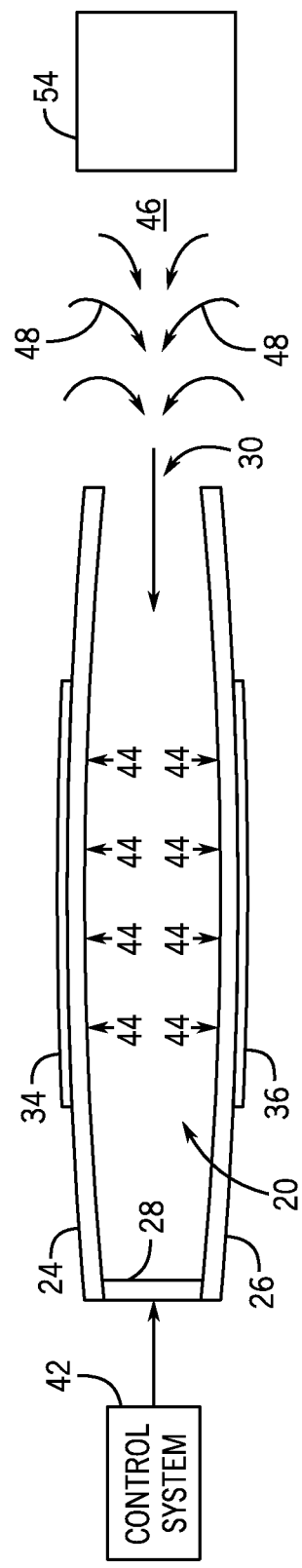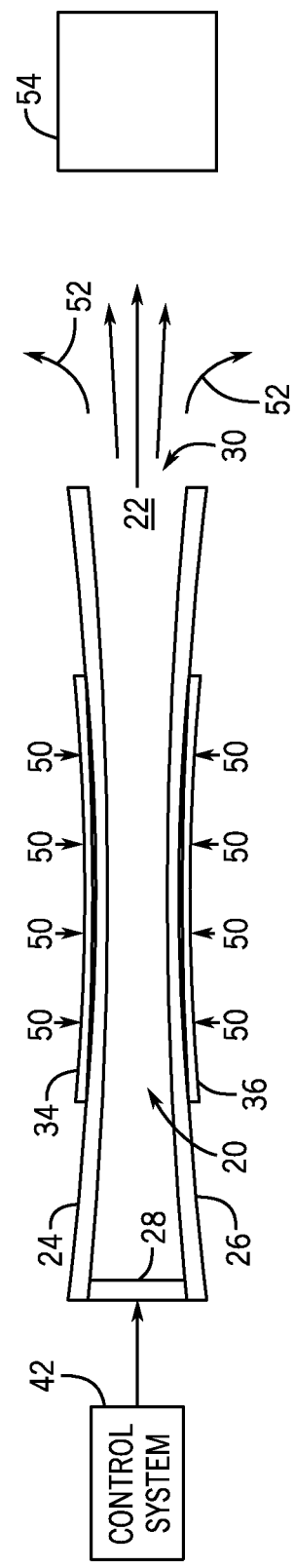

VIBRATIONAL FLUID MOVER JET WITH ACTIVE DAMPING MECHANISM

BACKGROUND OF THE INVENTION

Vibrational fluid movers, such as synthetic jet actuators for example, are a widely-used technology that generates a jet of fluid to influence the flow of that fluid over a surface to disperse heat away therefrom. A typical vibrational fluid mover comprises a housing defining an internal chamber. An orifice is present in a wall of the housing. The vibrational fluid mover further includes a mechanism in or about the housing for periodically changing the volume within the internal chamber so that a series of fluid vortices are generated and projected in an external environment out from the orifice of the housing. Examples of volume changing mechanisms may include, for example, a piston positioned in the jet housing to move fluid in and out of the orifice during reciprocation of the piston or a flexible diaphragm as a wall of the housing. The flexible diaphragm is typically actuated by a piezoelectric actuator or other appropriate means.

Typically, a control system is used to create time-harmonic motion of the volume changing mechanism. As the mechanism decreases the chamber volume, fluid is ejected from the chamber through the orifice. For a synthetic jet actuator, as the fluid passes through the orifice, sharp edges of the orifice separate the flow to create vortex sheets that roll up into vortices. These vortices move away from the edges of the orifice under their own self-induced velocity. As the mechanism increases the chamber volume, ambient fluid is drawn into the chamber from large distances from the orifice. Since the vortices have already moved away from the edges of the orifice, they are not affected by the ambient fluid entering into the chamber. As the vortices travel away from the orifice, they synthesize a jet of fluid, i.e., a "synthetic jet."

It is recognized that vibration propagation is one negative aspect of vibrational fluid movers in operation. With respect to such vibration propagation, it is highly desirable to prevent vibrations from being transmitted from the moving surfaces of the vibrational fluid mover to a mounting structure to which it is attached and/or passed on to the surrounding structures or surfaces the mounting structure is attached to. While providing a mounting structure that minimizes vibration propagation is achievable, such mounting structures also should be designed so as not to dampen the fluid output of the vibrational fluid mover, as can occur if the vibrational fluid mover is restrained rigidly to a fixed stationary surface.

It would therefore be desirable to provide a mounting structure that provides vibration dampening by limiting the amount of undesirable vibrations transmitted from the moving surfaces of the synthetic jet to the mounting structure and to the surfaces the mounting structure is attached to. It would also be desirable for the mounting structure to allow the synthetic jet to function with less dampening on the airflow output than if it was restrained more rigidly to a fixed stationary surface.

BRIEF DESCRIPTION OF THE INVENTION

According to one aspect of the invention, a vibrational fluid mover assembly includes a vibrational fluid mover having a first plate, a second plate spaced apart from the first plate, a spacer element positioned between the first and second plates to maintain the first and second plates in a spaced apart relationship, the spacer element including an orifice formed therein, and an actuator element coupled to at least one of the first and second plates to selectively cause deflection thereof such that a fluid flow is generated and projected out from the orifice. The vibrational fluid mover assembly also includes an absorber system connected to the vibrational fluid mover and providing active damping to the vibrational fluid mover, with the absorber system having a plurality of suspension tabs coupled to the vibrational fluid mover and a plurality of spring components configured to mount the vibrational fluid mover in a suspended arrangement.

In accordance with another aspect of the invention, a vibrational fluid mover assembly comprises a vibrational fluid mover that includes a body having a cavity and an orifice formed therein and at least one actuator element coupled to the body to selectively cause deflection of the body and thereby generate and project a fluid flow out from the orifice. The vibrational fluid mover assembly also comprises a dynamic absorber system connected to the vibrational fluid mover, with the dynamic absorber system including a plurality of spring components configured to mount the vibrational fluid mover in a suspended arrangement relative to an external system and a plurality of suspension tabs coupling the vibrational fluid mover to the plurality of spring components, wherein the plurality of spring components and the plurality of suspension tabs provide active damping to the vibrational fluid mover.

In accordance with yet another aspect of the invention, a vibrational fluid mover assembly includes a vibrational fluid mover having a first plate, a second plate spaced apart from the first plate, a spacer element having an orifice formed therein and being positioned between the first and second plates to maintain the first and second plates in a spaced apart relationship, and an actuator element coupled to at least one of the first and second plates to selectively cause deflection thereof such that a fluid flow is generated and projected out from the orifice. The vibrational fluid mover assembly also includes a mounting bracket positioned at least partially about the vibrational fluid mover to support the vibrational fluid mover, the mounting bracket having a groove formed therein along an inner edge of the mounting bracket. The vibrational fluid mover assembly further includes a plurality of suspension tabs coupling the vibrational fluid mover to the mounting bracket, with the plurality of suspension tabs being interfit with the groove to provide a semi-flexible connection between the vibrational fluid mover and the mounting bracket.

These and other advantages and features will be more readily understood from the following detailed description of preferred embodiments of the invention that is provided in connection with the accompanying drawings.

BRIEF DESCRIPTION OF THE DRAWINGS

The drawings illustrate embodiments presently contemplated for carrying out the invention.

In the drawings:

FIG. 3 is a cross-section of the synthetic jet of FIG. 2 depicting the jet as the control system causes the diaphragms to travel inward, toward the orifice.

FIG. 4 is a cross-section of the synthetic jet actuator of FIG. 2 depicting the jet as the control system causes the diaphragms to travel outward, away from the orifice.

DESCRIPTION OF THE INVENTION

Embodiments of the invention are directed to an active damping mechanism for a vibrational fluid mover. The active damping mechanism provides for the reduction and/or removal of the associated mechanical vibration from the vibrational fluid mover during the operation thereof. The active damping mechanism provides vibration dampening by enabling use of the overall system to which the vibrational fluid mover is attached as a large sink to absorb the energy and mechanical vibration associated with operation of the vibrational fluid mover.

For purposes of better understanding aspects of the invention, an exemplary embodiment of a vibrational fluid mover—and of the operation thereof—is illustrated in FIGS. 1-4 that may be utilized in embodiments of the invention. It is recognized that embodiments of the invention are not meant to be limited to use of a specific vibrational fluid mover; however, in an exemplary embodiment, a vibration-type air mover is utilized, and thus reference hereafter is made to a synthetic jet or synthetic jet actuator when discussing embodiments of the invention.

Figure 1:
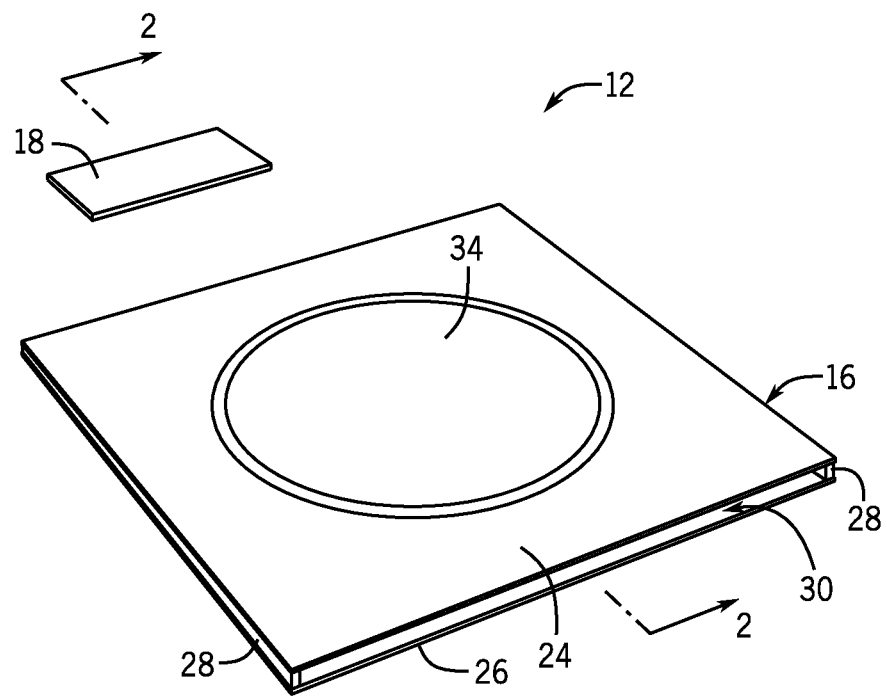
FIG. 1 is a perspective view of a synthetic jet useable with embodiments of the invention.
Figure 2:
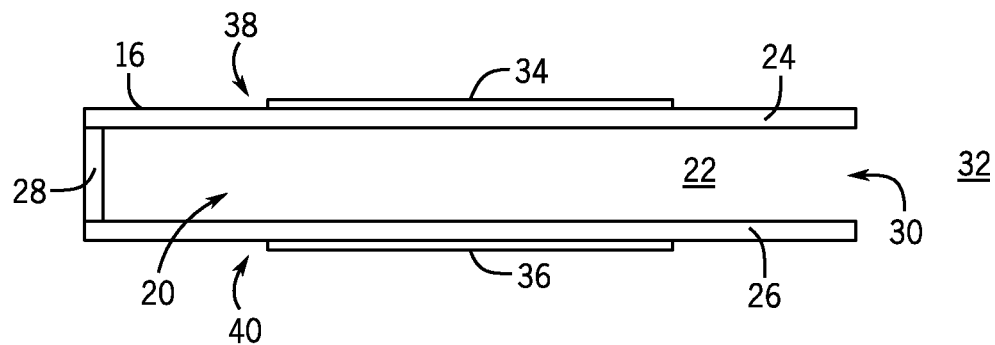
FIG. 2 is a cross-section of a portion of a synthetic jet useable with embodiments of the invention.

Referring to FIG. 1 and, a synthetic jet 12 is provided that generally includes a body or housing 16 and a circuit driver 18 that drives the synthetic jet. Housing 16 of synthetic jet 12 defines and partially encloses an internal chamber or cavity 20 having a gas or fluid 22 therein. While housing 16 and internal chamber 20 can take virtually any geometric configuration according to various embodiments of the invention, for purposes of discussion and understanding, housing 16 is shown in cross-section in FIG. 2 as including a first plate 24 and a second plate 26, which are maintained in a spaced apart relationship by a spacer element 28 positioned therebetween. In one embodiment, spacer element 28 maintains a separation of approximately 1 mm between first and second plates 24, 26. One or more orifices or openings 30 are formed between first and second plates 24, 26 and the side walls of spacer element 28 in order to place the internal chamber 20 in fluid communication with a surrounding, exterior environment 32. In an alternative embodiment, spacer element 28 includes a front surface (not shown) in which one or more orifices 30 are formed.

According to various embodiments, first and second plates 24, 26 may be formed from a metal, plastic, glass, and/or ceramic. Likewise, spacer element 28 may be formed from a metal, plastic, glass, and/or ceramic. Suitable metals include materials such as nickel, aluminum, copper, and molybdenum, or alloys such as stainless steel, brass, bronze, and the like. Suitable polymers and plastics include thermoplastics such as polyolefins, polycarbonate, thermosets, epoxies, urethanes, acrylics, silicones, polyimides, and photoresist-capable materials, and other resilient plastics. Suitable ceramics include, for example, titanates (such as lanthanum titanate, bismuth titanate, and lead zirconate titanate) and molybdates. Furthermore, various other components of synthetic jet 12 may be formed from metal as well.

Actuators 34, 36 are coupled to respective first and second plates, 24, 26 to form first and second composite structures or flexible diaphragms 38, 40, which are controlled by driver 18 via a controller assembly or control unit system (not shown). For example, each flexible diaphragm 38, 40 may be equipped with a metal layer and a metal electrode may be disposed adjacent to the metal layer so that diaphragms 38, 40 may be moved via an electrical bias imposed between the electrode and the metal layer.

In one embodiment, actuators 34, 36 are piezoelectric motive (piezomotive) devices that may be actuated by application of a harmonic alternating voltage that causes the piezomotive devices to rapidly expand and contract. During operation, driver 18 (and the associated control system) transmits an electric charge to piezoelectric actuators 34, 36, which undergo mechanical stress and/or strain responsive to the charge. The stress/strain of piezomotive actuators 34, 36 causes deflection of respective first and second plates 24, 26 such that a time-harmonic or periodic motion is achieved that changes the volume of the internal chamber 20 between plates 24, 26. According to one embodiment, spacer element 28 can also be made flexible and deform to change the volume of internal chamber 20. The resulting volume change in internal chamber 20 causes an interchange of gas or other fluid between internal chamber 20 and exterior volume 32, as described in detail with respect to FIGS. 3 and 4.

Piezomotive actuators 34, 36 may be monomorph or bimorph devices, according to various embodiments of the invention. In a monomorph embodiment, piezomotive actuators 34, 36 may be coupled to plates 24, 26 formed from materials including metal, plastic, glass, or ceramic. In a bimorph embodiment, one or both piezomotive actuators 34, 36 may be bimorph actuators coupled to plates 24, 26 formed from piezoelectric materials. In an alternate embodiment, the bimorph may include single actuators 34, 36, and plates 24, 26 are the second actuators.

The components of synthetic jet 12 may be adhered together or otherwise attached to one another using adhesives, solders, and the like. In one embodiment, a thermoset adhesive or an electrically conductive adhesive is employed to bond actuators 34, 36 to first and second plates, 24, 26 to form first and second composite structures 38, 40. In the case of an electrically conductive adhesive, an adhesive may be filled with an electrically conductive filler such as silver, gold, and the like, in order to attach lead wires (not shown) to synthetic jet 12. Suitable adhesives may have a hardness in the range of Shore A hardness of 100 or less and may include as examples silicones, polyurethanes, thermoplastic rubbers, and the like, such that an operating temperature of 120 degrees or greater may be achieved.

In an embodiment of the invention, actuators 34, 36 may include devices other than piezoelectric motive devices, such as hydraulic, pneumatic, magnetic, electrostatic, and ultrasonic materials. Thus, in such embodiments, driver 18 (and the associated control system) is configured to activate respective actuators 34, 36 in corresponding fashion. For example, if electrostatic materials are used, a rapidly alternating electrostatic voltage may be applied to actuators 34, 36 in order to activate and flex respective first and second plates 24, 26.

The operation of synthetic jet 12 is described with reference to FIGS. 3 and 4. Referring first to FIG. 3, synthetic jet 12 is illustrated as actuators 34, 36 are controlled to cause first and second plates 24, 26 to move outward with respect to internal chamber 20, as depicted by arrows 44. As first and second plates 24, 26 flex outward, the internal volume of internal chamber 20 increases, and ambient fluid or gas 46 rushes into internal chamber 20 as depicted by the set of arrows 48. Actuators 34, 36 are controlled by driver 18 so that when first and second plates 24, 26 move outward from internal chamber 20, vortices are already removed from edges of orifice 30 and thus are not affected by the ambient fluid 46 being drawn into internal chamber 20. Meanwhile, a jet of ambient fluid 46 is synthesized by vortices creating strong entrainment of ambient fluid 46 drawn from large distances away from orifice 30.

FIG. 4 depicts synthetic jet 12 as actuators 34, 36 are controlled to cause first and second plates 24, 26 to flex inward into internal chamber 20, as depicted by arrows 50. The internal volume of internal chamber 20 decreases, and fluid 22 is ejected as a cooling jet through orifice 30 in the direction indicated by the set of arrows 52 toward a device 54 to be cooled, such as, for example a light emitting diode. As the fluid 22 exits internal chamber 20 through orifice 30, the fluid flow separates at the sharp edges of orifice 30 and creates vortex sheets which roll into vortices and begin to move away from edges of orifice 30.

While the synthetic jet of FIGS. 1-4 is shown and described as having a single orifice therein, it is also envisioned that embodiments of the invention may include multiple orifice synthetic jet actuators. Additionally, while the synthetic jet actuators of FIGS. 1-4 are shown and described as having an actuator element included on each of first and second plates, it is also envisioned that embodiments of the invention may include only a single actuator element positioned on one of the plates. Furthermore, it is also envisioned that the synthetic jet plates may be provided in a circular, rectangular, or alternatively shaped configuration, rather than in a square configuration as illustrated herein.

Figure 5:
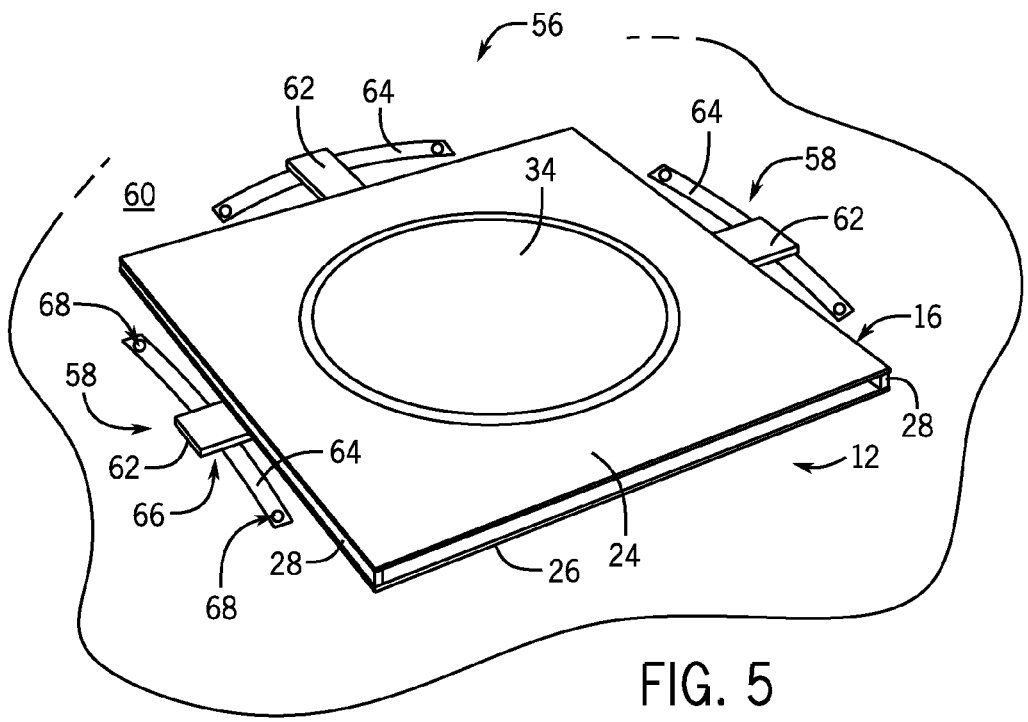
FIG. 5 is a perspective view of a synthetic jet assembly, according to an embodiment of the invention.

Referring now to FIG. 5, a synthetic jet assembly 56 incorporating a synthetic jet 12 as shown and described in FIGS. 1-4 is provided according to one embodiment of the invention. In addition to including synthetic jet 12, synthetic jet assembly 56 also includes therein a dynamic absorber system 58 that provides for mounting of the synthetic jet assembly in a desired manner. The absorber system 58 beneficially enables a smooth operation of the synthetic jet 12 without any feeling of mechanical vibration by the end user when he or she is touching and handling a system or component 60 in which the synthetic jet assembly 56 is incorporated and to which the synthetic jet assembly 56 is attached.

As shown in FIG. 5, according to one embodiment, the absorber system 58 is formed of a number of suspension tabs 62 and spring brackets 64 that function to suspend the synthetic jet 12 from a surface of the system/component 60 to which the synthetic jet assembly 56 is mounted so as to isolate the moving parts of the synthetic jet assembly 12. The suspension tabs 62 assist in locating the synthetic jet 12 in a specific desired location with less constraints than if the synthetic jet's moving surfaces were attached to a fixed mounting surface more rigidly and also allow the synthetic jet 12 to function with less dampening on the airflow output than if it was restrained more rigidly to a fixed stationary surface. The suspension tabs 62 may be formed in a number of different manners, including being applied or dispensed at desired locations.

According to an exemplary embodiment of the invention, the suspension tabs 62 are constructed of a semi-flexible material that provides a connection between the body 16 of the synthetic jet 12 and the spring bracket 64. According to an exemplary embodiment, the suspension tabs 62 form a connection between the spacer element 28 (FIGS. 1-4) of the synthetic jet 12 and the spring brackets 64; however, it is envisioned that the suspension tabs 62 could instead form a connection between the plates 24, 26 of the synthetic jet 12 and the spring brackets 64. The suspension tabs 62 may be formed of any of a number of suitable elastomeric materials, including saturated and unsaturated rubbers. As one example, the suspension tabs 62 are formed of a silicone elastomer or silicone adhesive that provides the flexible or semi-flexible connection between the synthetic jet 12 and the spring brackets 64. The semi-flexible suspension tabs 62 are constructed to have a mechanical strength sufficient to hold the synthetic jet 12 in a mostly stationary position relative to spring brackets 64 but offer a limited flexibility that provides vibration dampening by limiting the amount of undesirable vibrations that are transmitted from the moving surfaces of the synthetic jet 12 to the spring brackets 64 (and further onto the surface or substrate the spring bracket is attached to). The specific material composition of the suspension tabs 62 can be chosen to selectively control the amount of vibration dampening.

The amount of vibration dampening provided by suspension tabs 62 is a function not only of the material composition of the tabs, but also the size, location and quantity of the suspension tabs 62. Accordingly the size, location and quantity of the suspension tabs 62 employed to affix the synthetic jet 12 to the spring brackets 64 may be selected during fabrication/manufacturing of the synthetic jet assembly 10 to selectively control vibration dampening. According to one embodiment, and as shown in FIG. 5, an arrangement of three suspension tabs 62 is provided to which spring brackets 64 are attached. It is recognized, however, that various embodiments and arrangements of the tabs 62 may be provided in the synthetic jet assembly 56 that differ from the three tabs shown in FIG. 5. However, while the size, location and quantity of the suspension tabs 62 varies between the specific embodiments, it is recognized that—in each embodiment—at least one suspension tab 62 is located on each side of the synthetic jet 12, so as to provide for adequate mounting of the synthetic jet.

As shown in FIG. 5, a spring bracket 64 is affixed to each of the suspension tabs 62 generally at a mid-point 66 of the spring bracket 64, with an adhesive (for example) securing the spring bracket 64 to its respective suspension tab 62. The spring brackets 64 may be formed of any of a number of suitable metallic materials that provide suitable flexing properties, such as a stainless steel alloy for example. The spring bracket 64 includes a hole 68 formed at each of opposing ends thereof that is able to receive a fastener (e.g., screw) therein. By providing fasteners at the opposing ends through holes 68, each spring bracket 64—and the overall synthetic jet assembly 56—can be secure to a system/component 60 to which the synthetic jet assembly is to be mounted.

The spring brackets 64 included in the absorber system 58 are designed to function as flat springs that provide active/dynamic damping to the synthetic jet assembly 56. The spring brackets 64 are aligned lengthwise along the sides of the synthetic jet 12 and flex responsive to mechanical vibrations generated by the synthetic jet during operation thereof. By mounting of the synthetic jet 12 to a system/component 60 via the spring brackets 64, the reduction and/or removal of the associated mechanical vibration from operation of the synthetic jet 12 may be achieved.

Figure 6:
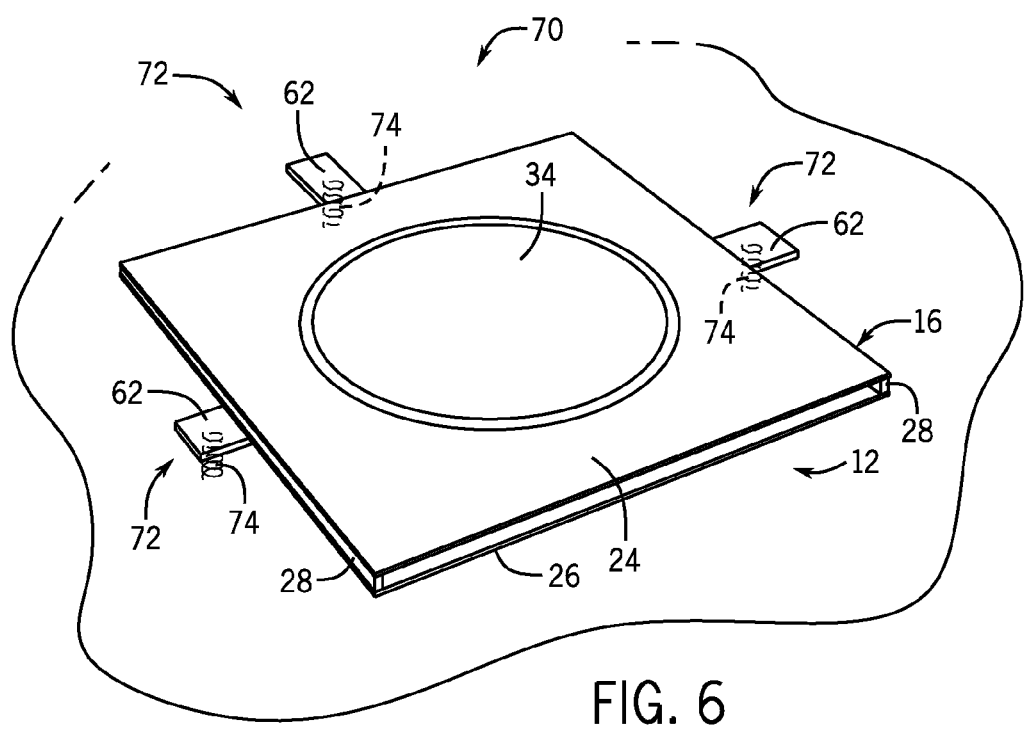
FIG. 6 is a perspective view of a synthetic jet assembly, according to an embodiment of the invention.

Referring now to FIG. 6, a synthetic jet assembly 70 is shown according to another embodiment of the invention. The synthetic jet assembly 70 includes therein a dynamic absorber system 72 that provides for mounting of the synthetic jet 12 in a desired manner, with the absorber system 72 being formed of a number of suspension tabs 62 and coil springs 74 that function to suspend the synthetic jet 12 from a surface 60 to which the synthetic jet assembly is mounted so as to isolate the moving parts of the synthetic jet assembly 70.

Similar to the absorber system 58 included in the synthetic jet assembly of FIG. 5, the suspension tabs 62 of absorber system 72 are constructed of a semi-flexible material, including any of a number of suitable elastomeric materials, such as saturated and unsaturated rubbers. The semi-flexible suspension tabs 62 are constructed to have a mechanical strength sufficient to hold the synthetic jet 12 in a mostly stationary position relative to coil springs 74 but offer a limited flexibility that provides vibration dampening by limiting the amount of undesirable vibrations that are transmitted from the moving surfaces of the synthetic jet 12 to the coil springs 74 (and further onto the surface or component 60 the coil spring 74 is attached to).

As shown in FIG. 6, a coil spring 74 is affixed to each of the suspension tabs 62 on an underside thereof, with the coil spring 74 being affixed such as by way of an adhesive, for example. The coil springs 74 of the absorber system 72 are further secured to a system/component 60 to which the synthetic jet assembly 70 is to be mounted and function to suspend the synthetic jet 12 therefrom. The coil springs 74 can be selected to have stiffness as desired by a user based on the operating characteristics of the synthetic jet 12.

Figure 7:
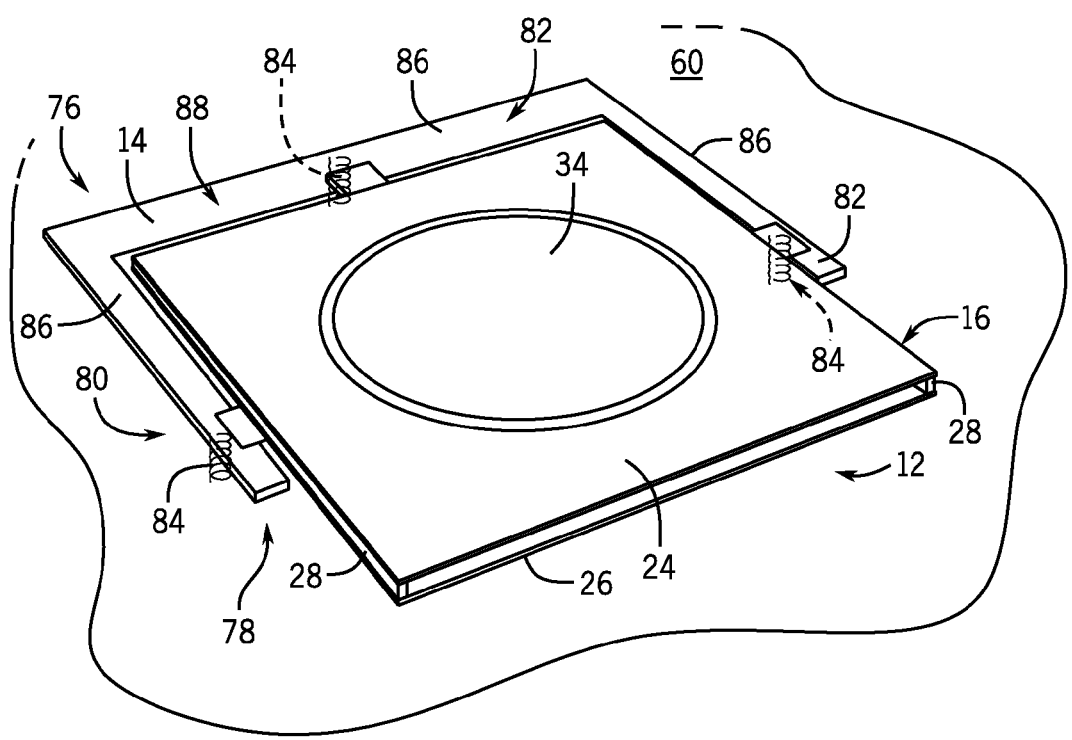
FIG. 7 is a perspective view of a synthetic jet assembly, according to an embodiment of the invention.

Referring now to FIG. 7, a synthetic jet assembly 76 is shown according to another embodiment of the invention. The synthetic jet assembly 76 includes therein a dynamic absorber system 78 that provides for mounting of the synthetic jet 12 in a desired manner, with the absorber system 78 being formed of a number of suspension tabs 62 and a mounting bracket assembly 80 that function to suspend the synthetic jet 12 from a surface 60 to which the synthetic jet assembly 76 is mounted so as to isolate the moving parts of the synthetic jet assembly 76.

The suspension tabs 62 of absorber system 78 are similar to the suspension tabs included in the absorber system of FIGS. 5 and 6, with the tabs 62 being constructed of a semi-flexible material, including any of a number of suitable elastomeric materials, such as saturated and unsaturated rubbers.

The mounting bracket assembly 80 includes a mounting bracket 82 and a plurality of coil springs 84 attached to the mounting bracket 82. In one embodiment, the mounting bracket 82 is formed as a rigid, metallic u-shaped mounting bracket having a plurality of legs 86 (i.e., side legs and back/connecting leg) and is affixed to the housing 16 of the synthetic jet 12 at one or more locations by way of the suspension tabs 62. The suspension tabs 62 may be applied or dispensed at desired locations so as connect to the top surface 88 of the mounting bracket 82 and to the synthetic jet 12, such that a connection between the synthetic jet 12 and the mounting bracket 82 is formed. While the absorber system 78 is shown in FIG. 7 as employing three suspension tabs 62 for affixing the synthetic jet 12 to the mounting bracket 82, it is recognized that a different number of suspension tabs could be used and a location of the tabs could be varied—with it being recognized that at least one suspension tab 62 should be provided on each of three sides of the synthetic jet 12 to provide at least three mounting points between the mounting bracket 82 and the body 16 of the synthetic jet 12.

As shown in FIG. 7, a number of coil springs 84 are affixed to the mounting bracket 82 on an underside thereof, with the coil springs 84 being affixed such as by way of an adhesive, for example. In one embodiment, a coil spring 84 is attached to the mounting bracket 82 adjacent to where a corresponding suspension tab 62 is affixed to the mounting bracket, such that the number and location of the coil springs 84 corresponds to that of the suspension tabs 62. It is recognized, however, that additional coil springs 84 could be attached to the mounting bracket 82 and at locations not corresponding to the suspension tabs 62. The coil springs 84 of the absorber system 78 secure the mounting bracket 82 to a system/component 60 to which the synthetic jet assembly 76 is to be mounted and function to suspend the synthetic jet assembly 76 therefrom, with the coil springs 84 having a stiffness as desired by a user based on the operating characteristics of the synthetic jet 12.

Figure 8:
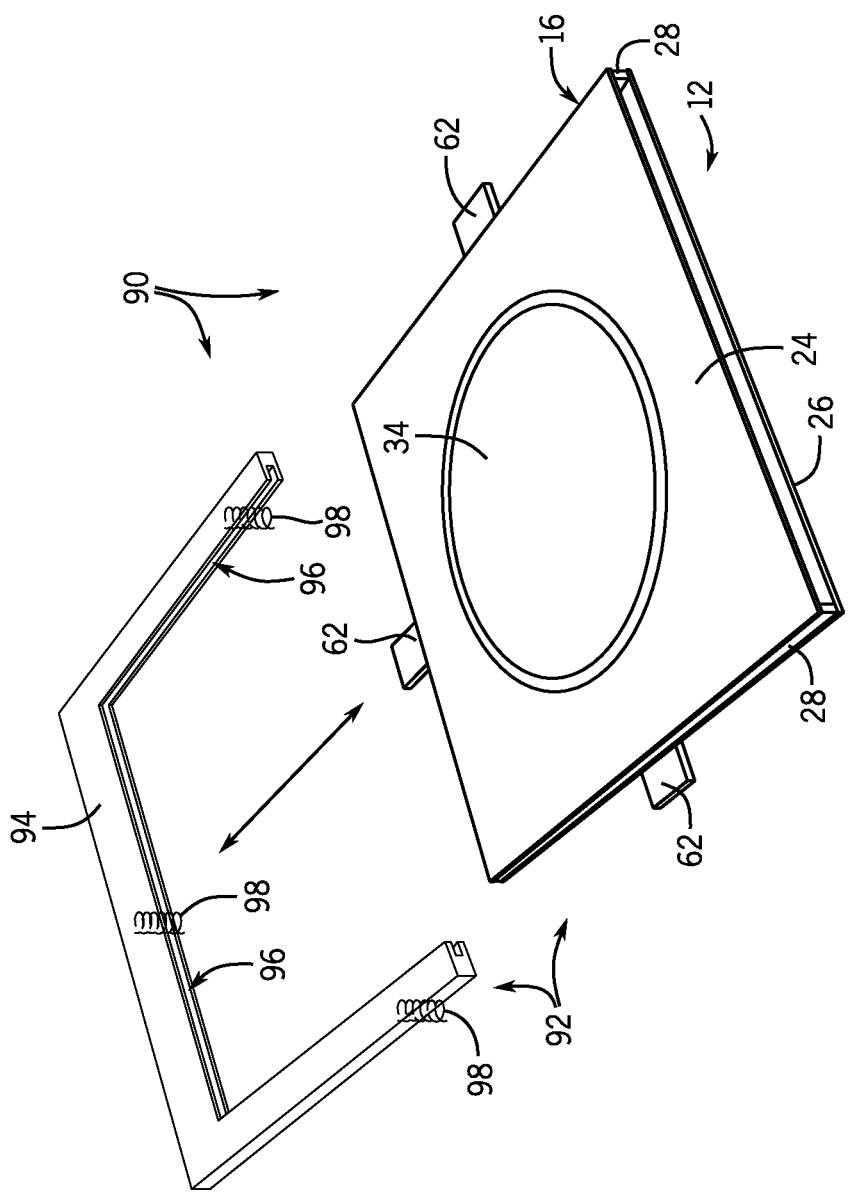
FIG. 8 is an exploded perspective view of a synthetic jet assembly, according to an embodiment of the invention.

Referring now to FIG. 8, an exploded view of a synthetic jet assembly 90 is shown according to another embodiment of the invention. The synthetic jet assembly 90 is similar to that shown in FIG. 7 in that it includes therein a dynamic absorber system 92 having a number of suspension tabs 62 and a mounting bracket assembly 80 that function to suspend the synthetic jet 12 from a surface to which the synthetic jet assembly 90 is mounted so as to isolate the moving parts of the synthetic jet assembly. However, the mounting bracket 94 in absorber system 92 is formed to include a groove 96 formed therein along an inner edge of the bracket 94. The groove 96 is sized and configured to provide for a fitting of the suspension tabs 62 therein, such that—rather than the suspension tabs 62 being applied onto a top surface of the mounting bracket 94 (as in FIG. 7)—the tabs 62 can be interfit with the groove 96. Mating of the suspension tabs 62 in the groove 96 of mounting bracket 94 reduces even further the constraints on the synthetic jet 12 and allow the synthetic jet 12 to function with less dampening on the airflow output.

As further shown in FIG. 8, the absorber system 92 can also include a number of coil springs 98 affixed to the mounting bracket 94 on an underside thereof, although the springs are not required. In one embodiment, a coil spring 98 is attached to the mounting bracket 94 adjacent to where a corresponding suspension tab 62 is affixed to the mounting bracket 94 (in groove 96), such that the number and location of the coil springs 98 corresponds to that of the suspension tabs 62. It is recognized, however, that additional coil springs 98 could be attached to the mounting bracket 94 and at locations not corresponding to the suspension tabs 62.

It is recognized that the synthetic jet assemblies described above are not limited to structures that include square/rectangular synthetic jets 12 and/or a u-shaped mounting bracket (FIGS. 7 and 8). That is, the synthetic jet assemblies having other shapes and configurations are also envisioned as falling within the scope of the invention. For example, a synthetic jet assembly that includes a circular synthetic jet is considered to be within the scope of the invention.

Beneficially, embodiments of the invention thus provide a vibrational fluid mover assembly including a dynamic absorber system that functions to suspend the synthetic jet with respect to the system/component to which it is to be mounted so as to isolate the moving parts of the synthetic jet assembly. The absorber system includes an arrangement of suspension tabs and springs that provide a low cost method of restraining the synthetic jet in a specified location (i.e., locating the synthetic jet in a specific desired location) with less constraints than if the synthetic jet's moving surfaces were attached to a fixed mounting surface more rigidly. The absorber system also allows the synthetic jet to function with minimal impact regarding dampening the positive airflow the synthetic jet generates (i.e., the airflow output), as compared to if it was restrained more rigidly to a fixed stationary surface.

Therefore, according to one embodiment of the invention, a vibrational fluid mover assembly includes a vibrational fluid mover having a first plate, a second plate spaced apart from the first plate, a spacer element positioned between the first and second plates to maintain the first and second plates in a spaced apart relationship, the spacer element including an orifice formed therein, and an actuator element coupled to at least one of the first and second plates to selectively cause deflection thereof such that a fluid flow is generated and projected out from the orifice. The vibrational fluid mover assembly also includes an absorber system connected to the vibrational fluid mover and providing active damping to the vibrational fluid mover, with the absorber system having a plurality of suspension tabs coupled to the vibrational fluid mover and a plurality of spring components configured to mount the vibrational fluid mover in a suspended arrangement.

According to another aspect of the invention, a vibrational fluid mover assembly comprises a vibrational fluid mover that includes a body having a cavity and an orifice formed therein and at least one actuator element coupled to the body to selectively cause deflection of the body and thereby generate and project a fluid flow out from the orifice. The vibrational fluid mover assembly also comprises a dynamic absorber system connected to the vibrational fluid mover, with the dynamic absorber system including a plurality of spring components configured to mount the vibrational fluid mover in a suspended arrangement relative to an external system and a plurality of suspension tabs coupling the vibrational fluid mover to the plurality of spring components, wherein the plurality of spring components and the plurality of suspension tabs provide active damping to the vibrational fluid mover.

According to yet another aspect of the invention, a vibrational fluid mover assembly includes a vibrational fluid mover having a first plate, a second plate spaced apart from the first plate, a spacer element having an orifice formed therein and being positioned between the first and second plates to maintain the first and second plates in a spaced apart relationship, and an actuator element coupled to at least one of the first and second plates to selectively cause deflection thereof such that a fluid flow is generated and projected out from the orifice. The vibrational fluid mover assembly also includes a mounting bracket positioned at least partially about the vibrational fluid mover to support the vibrational fluid mover, the mounting bracket having a groove formed therein along an inner edge of the mounting bracket. The vibrational fluid mover assembly further includes a plurality of suspension tabs coupling the vibrational fluid mover to the mounting bracket, with the plurality of suspension tabs being interfit with the groove to provide a semi-flexible connection between the vibrational fluid mover and the mounting bracket.

While the invention has been described in detail in connection with only a limited number of embodiments, it should be readily understood that the invention is not limited to such disclosed embodiments. Rather, the invention can be modified to incorporate any number of variations, alterations, substitutions or equivalent arrangements not heretofore described, but which are commensurate with the spirit and scope of the invention. Additionally, while various embodiments of the invention have been described, it is to be understood that aspects of the invention may include only some of the described embodiments. Accordingly, the invention is not to be seen as limited by the foregoing description, but is only limited by the scope of the appended claims.

What is claimed is:

1. A vibrational fluid mover assembly comprising:
a vibrational fluid mover including:
 a first plate;
 a second plate spaced apart from the first plate;
 a spacer element positioned between the first and second plates to maintain the first and second plates in a spaced apart relationship, the spacer element including an orifice formed therein; and
 an actuator element coupled to at least one of the first and second plates to selectively cause deflection thereof such that a fluid flow is generated and projected out from the orifice; and
an absorber system connected to the vibrational fluid mover and providing active damping to the vibrational fluid mover, the absorber system comprising:
 a plurality of suspension tabs coupled to the vibrational fluid mover and extending out horizontally therefrom, the plurality of suspension tabs being spaced about a perimeter of the vibrational fluid mover; and
 a plurality of spring components coupled to the plurality of suspension tabs on a bottom surface thereof and configured to mount the vibrational fluid mover in a suspended arrangement.

2. The vibrational fluid mover assembly of claim 1 wherein each of the plurality of suspension tabs is formed of an elastomeric material that provides vibration dampening for the vibrational fluid mover.

3. The vibrational fluid mover assembly of claim 1 wherein each of the plurality of suspension tabs is formed of a silicon adhesive and is directly coupled to a respective spring component.

4. The vibrational fluid mover assembly of claim 1 wherein the plurality of spring components comprise spring brackets, with each spring bracket being attached to a respective suspension tab and providing vibration dampening for the vibrational fluid mover.

5. The vibrational fluid mover assembly of claim 4 wherein each spring bracket is attached to a respective suspension tab at a mid-point of the spring bracket.

6. The vibrational fluid mover assembly of claim 5 wherein each spring bracket includes a pair of openings formed at opposing ends of the spring bracket, the pair of openings configured to receive fasteners therein for securing the spring bracket to an external component or system.

7. The vibrational fluid mover assembly of claim 1 wherein the plurality of spring components comprise coil springs, with each coil spring being attached to a respective suspension tab and providing vibration dampening for the vibrational fluid mover.

8. The vibrational fluid mover assembly of claim 1 wherein the absorber system further comprises a mounting bracket positioned at least partially about the vibrational fluid mover, with the plurality of suspension tabs being coupling to the mounting bracket to provide a semi-flexible connection between the vibrational fluid mover and the mounting bracket.

9. The vibrational fluid mover assembly of claim 8 wherein the mounting bracket comprises a U-shaped mounting bracket having a rear leg connecting a pair of side legs, and wherein the plurality of suspension tabs are arranged such that at least one suspension tab is located on each leg of the U-shaped bracket.

10. The vibrational fluid mover assembly of claim 8 wherein the mounting bracket includes a groove formed therein along an inner edge of the mounting bracket, with the plurality of suspension tabs being fit into the grooves to secure the vibrational fluid mover to the mounting bracket.

11. The vibrational fluid mover assembly of claim 8 wherein the plurality of spring components comprise coil springs, with each coil spring being attached to an underside of the mounting bracket.

12. The vibrational fluid mover assembly of claim 1 wherein the vibrational fluid mover comprises a synthetic jet.

13. The vibrational fluid mover assembly of claim 8 wherein the plurality of spring components comprise coil springs, and wherein the plurality of coil springs are attached to the mounting bracket.

14. A vibrational fluid mover assembly comprising:
   a vibrational fluid mover comprising:
      a body having a cavity and an orifice formed therein; and
      at least one actuator element coupled to the body to selectively cause deflection of the body and thereby generate and project a fluid flow out from the orifice; and
   a dynamic absorber system connected to the vibrational fluid mover, the dynamic absorber system comprising:
      a plurality of spring components configured to mount the vibrational fluid mover in a suspended arrangement relative to an external system; and
      a plurality of suspension tabs coupling the vibrational fluid mover to the plurality of spring components, the plurality of suspension tabs coupled to the vibrational fluid mover and extending out horizontally therefrom to attach to the plurality of spring components;
   wherein the plurality of spring components and the plurality of suspension tabs provide active damping to the vibrational fluid mover,
   wherein the plurality of spring components are coupled to the plurality of suspension tabs on a bottom surface thereof.

15. The vibrational fluid mover assembly of claim 14 wherein each of the plurality of suspension tabs is formed of a silicon adhesive that adheres to a respective spring component to couple the vibrational fluid mover to the spring component.

16. The vibrational fluid mover assembly of claim 14 wherein the plurality of spring components comprise spring brackets, with each spring bracket being attached to a respective suspension tab at a mid-point of the spring bracket.

17. The vibrational fluid mover assembly of claim 14 wherein the plurality of spring components comprise coil springs.

18. A vibrational fluid mover assembly comprising:
   a vibrational fluid mover including:
      a first plate;
      a second plate spaced apart from the first plate;
      a spacer element positioned between the first and second plates to maintain the first and second plates in a spaced apart relationship, the spacer element including an orifice formed therein; and
      an actuator element coupled to at least one of the first and second plates to selectively cause deflection thereof such that a fluid flow is generated and projected out from the orifice;
   a mounting bracket positioned at least partially about the vibrational fluid mover to support the vibrational fluid mover, the mounting bracket having a groove formed therein along an inner edge of the mounting bracket;
   a plurality of suspension tabs coupling the vibrational fluid mover to the mounting bracket, with the plurality of suspension tabs being interfit with the groove to provide a semi-flexible connection between the vibrational fluid mover and the mounting bracket; and
   a plurality of coil springs attached to an underside of the mounting bracket to provide active damping to the vibrational fluid mover.

19. The vibrational fluid mover assembly of claim 18 wherein the mounting bracket comprises a U-shaped mounting bracket having a rear leg connecting a pair of side legs, and wherein the plurality of suspension tabs are arranged such that at least one suspension tab is interfitted with the groove formed on the inner edge on each leg of the U-shaped bracket.

* * * * *